(12) United States Patent
Sato et al.

(10) Patent No.: US 7,985,663 B2
(45) Date of Patent: Jul. 26, 2011

(54) METHOD FOR MANUFACTURING A SEMICONDUCTOR DEVICE

(75) Inventors: Takao Sato, Tokyo (JP); Soichi Homma, Kawasaki (JP); Masaya Shima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 12/471,923

(22) Filed: May 26, 2009

(65) Prior Publication Data

US 2009/0298228 A1 Dec. 3, 2009

(30) Foreign Application Priority Data

May 27, 2008 (JP) ................. P2008-138296
Oct. 30, 2008 (JP) ................. P2008-280132

(51) Int. Cl.
*H01L 21/00* (2006.01)
*H01L 23/495* (2006.01)

(52) U.S. Cl. ......... 438/464; 438/108; 438/123; 257/668

(58) Field of Classification Search .......... 438/108, 438/464; 257/668
See application file for complete search history.

(56) References Cited

U.S. PATENT DOCUMENTS

| 6,418,615 | B1 | 7/2002 | Rokugawa et al. |
| 6,803,324 | B2 | 10/2004 | Ogawa et al. |
| 7,884,484 | B2* | 2/2011 | Yamano et al. ............... 257/777 |
| 2001/0013425 | A1 | 8/2001 | Rokugawa et al. |
| 2002/0195272 | A1 | 12/2002 | Rokugawa et al. |
| 2004/0140551 | A1 | 7/2004 | Usui et al. |
| 2005/0017271 | A1 | 1/2005 | Rokugawa et al. |

FOREIGN PATENT DOCUMENTS

| JP | 9-18147 | 1/1997 |
| JP | 2000-196243 | 7/2000 |
| JP | 2000-323613 | 11/2000 |
| JP | 2004-200668 | 7/2004 |
| JP | 2007-173622 | 7/2007 |

* cited by examiner

*Primary Examiner* — Matthew C. Landau
*Assistant Examiner* — James M Mitchell
(74) *Attorney, Agent, or Firm* — Finnegan, Henderson, Farabow, Garrett & Dunner, L.L.P.

(57) ABSTRACT

A resin layer made of thermoplastic resin is formed on a supporting substrate, and then, an insulating layer is formed on the first resin layer. Then, an interlayer connector is formed through the insulating layer and then, a wiring layer is formed on the first resin layer so as to be electrically connected with the interlayer connector. Thereafter, a first semiconductor chip is mounted on the wiring layer. Then, the first resin layer is heated so that the supporting substrate and the insulating layer are relatively shifted one another to shear the first resin layer, thereby separating the supporting substrate and the insulating layer and forming a semiconductor device.

20 Claims, 10 Drawing Sheets

METHOD FOR MANUFACTURING A SEMICONDUCTOR DEVICE

CROSS-REFERENCE TO RELATED APPLICATIONS

This application is based upon and claims the benefit of priority from the prior Japanese Patent Applications No. 2008-138296 filed on May 27, 2008 and No. 2008-280132 filed on Oct. 30, 2008; the entire contents which are incorporated herein by reference.

BACKGROUND

In a semiconductor device to be mounted on a small and thin portable electronic device such as a cellular phone, the package area of the semiconductor device is narrow and the package height of the semiconductor device is small. Therefore, when a plurality of semiconductor chips are required to be mounted, the plurality of semiconductor chips are mounted on both surfaces of a single substrate to form a so-called double sided package semiconductor device. With the double sided package semiconductor device, the substrate would be made of resin or Si.

In the manufacture of the double sided package semiconductor device, first of all, a supporting substrate is prepared and the substrate is disposed on the supporting substrate, for example. Then, a predetermined wiring layer is formed on one surface of the substrate opposite to the supporting substrate and some semiconductor chips are formed on the wiring layer. Then, the supporting substrate is removed from the substrate and another wiring layer is formed on the other surface of the substrate to which the supporting substrate is attached so that the other semiconductor chips are additionally formed on another wiring layer. In this way, the intended double sided package semiconductor device can be manufactured.

The double sided package semiconductor device may be mounted on a mother board with external connecting circuits and external connecting terminals as occasion demands.

In the manufacture of the double sided package semiconductor device as described above, the supporting substrate can not be simply peeled off from the substrate by means of mechanical peeling because the thickness of the substrate is extremely thin up to about 10 μm. Therefore, various devices are implemented for the removal of the supporting substrate.

SUMMARY

An aspect of the present invention relates to a method for manufacturing a semiconductor device, including: forming a first resin layer made of thermoplastic resin on a supporting substrate; forming an insulating layer on the first resin layer; forming an interlayer connector through the insulating layer; forming a wiring layer on the first resin layer so as to be electrically connected with the interlayer connector; mounting a first semiconductor chip on the wiring layer; and heating the first resin layer so that the supporting substrate and the insulating layer are relatively shifted one another to shear the first resin layer, thereby separating the supporting substrate and the insulating layer.

Another aspect of the present invention relates to a method for manufacturing a semiconductor device, including: forming a first resin layer made of thermoplastic resin on a supporting substrate; forming a buffer layer on the first resin layer; forming an insulating layer on the first resin layer; forming an interlayer connector through the insulating layer; forming a wiring layer on the first resin layer so as to be electrically connected with the interlayer connector; mounting a first semiconductor chip on the wiring layer; and heating the first resin layer so that the supporting substrate and the buffer layer are relatively shifted one another to shear the first resin layer, thereby separating the supporting substrate and the buffer layer.

DETAILED DESCRIPTION OF THE INVENTION

Then, some embodiments will be described with reference to the drawings.

First Embodiment

FIG. 1 relates to the steps of the method for manufacturing a semiconductor device according to a first embodiment. First, as shown in FIG. 1A, a supporting substrate 11 is prepared and a first resin layer 12 made of thermoplastic resin is formed on the supporting substrate 11. The first resin layer 12 may be made by means of conventional technique such as spin coating, printing or laminating.

Figure 1A:
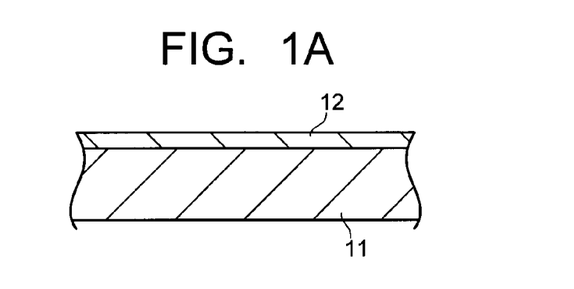
FIG. 1 relates to the steps of the method for manufacturing a semiconductor device according to a first embodiment.

The supporting substrate 11 is not particularly limited, but may be made of semiconductor substrate such as Si substrate, metallic substrate, glass substrate or the like which has a resistance for thermal treatment and chemical treatment in the manufacture of an intended semiconductor device.

The resin layer 12 is required to be made from thermoplastic resin such that the supporting substrate 11 can be peeled off from an insulating layer which is to be formed on the first resin layer 12 (i.e., an assembly containing the first resin layer 12) due to the shear stress when the insulating layer is relatively slid for the supporting substrate 11 under the condition of thermal treatment because the viscosity of the first resin layer 12 is lowered by the thermal treatment. Concretely, since the thermal treatment is carried out a temperature within a range of 150° C. to 300° C., the first resin layer 12 is preferably made of thermoplastic resin with a viscosity of 1000 Pa·s or less so that the supporting substrate 11 can be easily peeled off from the insulating layer.

As the thermoplastic resin satisfying the above-described requirement, polystyrene-based resin, methacrylic resin, polyethylene resin, polypropylene resin and cellulosic resin and the like can be exemplified. However, the thermoplastic resin making the first resin layer 12 is not limited to the one listed above. Any kind of thermoplastic resin can be applied to the thermoplastic resin only if the supporting substrate 11 can be easily peeled off from the insulating layer (i.e., the assembly containing the insulating layer).

The thickness of the first resin layer 12 may be set within a range of 0.1 μm to 70 μm.

Figure 1B:
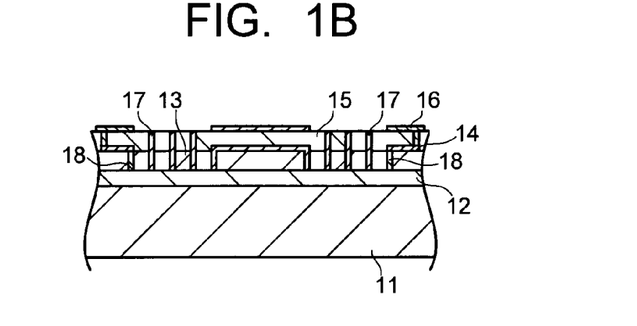

Then, as shown in FIG. 1B, a first insulating layer 13 is formed on the first resin layer 12, and then, via 18 functioning as an interlayer connector is formed through the first insulating layer 13. Thereafter, a first wiring layer 14 is formed on the first insulating layer 13 so as to be electrically connected with the via 18. Then, a second insulating layer 15 is formed on the first insulating layer 13, and the via 18 is formed through the second insulating layer 15, and then, via 17 also functioning as an interlayer connector is formed through the first insulating layer 13 and the second insulating layer 15. Thereafter, a second wiring layer 16 is formed on the first resin layer 15 so as to be electrically connected with the via 18. The via 17 functions as electrically and directly connecting semiconductor chips which are to be formed on both surfaces of a substrate made by integrating the first insulating layer 13 and the second insulating layer 15. The via 18 functions as electrically connecting the first wiring layer 14 and the second wiring layer 16, and electrically and directly connecting the semiconductor chips as the via 17 via the first wiring layer 14.

The first insulating layer 13 and the second insulating layer 15 may be made by means of conventional technique such as CVD, sputtering or spin coating. The first wiring layer 14 and the second wiring layer 16 may be made as follows. First of all, the corresponding plane metallic films are formed by means of conventional technique such as plating or sputtering and then, patterned by means of photolithography to form the layers 14 and 16.

The vias 17 and 18 may be made as follows. First of all, the corresponding via holes are formed through the first insulating layer 13 and the second insulating layer 15, and then, the metallic films to form the wiring layers 14 and 16 are also formed so as to embed the via holes per insulating layer at the same time when the wiring layers 14 and 16 are formed. In the case that the vias 17 and 18 are made by means of plating, as described later, the seeding films, each film being made as Ti film/Cu film, are formed in the via holes, respectively, and plating treatment is carried out for the via holes by using the seeding films as electrodes to form the vias 17 and 18.

In this embodiment, the number of insulating layer is set to two and the number of wiring layer is set to two. However, the numbers of insulating layer and wiring layer may be set to any number as occasion demands. For example, the numbers may be set to three or one. In FIG. 1B, another insulating layer is not formed on the top wiring layer 16, but may be formed.

Figure 1C:
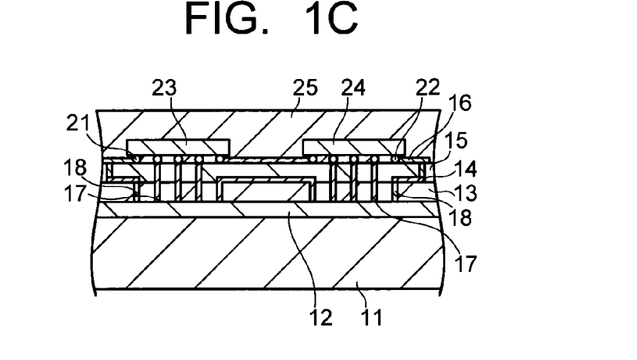

Then, as shown in FIG. 1C, a first semiconductor chip 23 with bumps 21 at the rear surface (functional surface) thereof and a second semiconductor chip 24 with bumps 22 at the rear surface (functional surface) thereof are prepared, and mounted such that the bumps 21 and 22 are electrically connected with the second wiring layer 16 and the via 17 (flip-chip package). If the second wiring layer 16 is made of Cu, the Cu material is connected with the bumps 21 and 22 of the semiconductor chips 23 and 24. Other pads, bumps or metallic film may be formed on the second wiring layer 16 before the flip-chip package. The bumps and the metallic film may be made of a metal such as SnAg, Au, Sn, Ag, Cu, Bi, In, Ge, Ni, Pd, Pt, Pb, a mixing layer made of ones of the listed metals, an alloy made of ones of the listed metals or a laminated film made of ones of the listed metals. Alternately, the bumps and the metallic film may be made of Ni/Pd/Au or Ni/Au by means of electroless plating.

The flip-chip package is carried out in a reflow furnace using a flip-chip bonder. The used flux is removed by a cleaning liquid. Alternately, the oxide films of the bumps 21 and 22 are removed by means of plasma, and then, the flip-chip package may be carried out by means of pulsed heating using a flip-chip bonder under the condition of no flux.

Herein, the bumps 21 and 22 may be made of a metal such as SnAg, Au, Sn, Ag, Cu, Bi, In, Ge, Ni, Pd, Pt, Pb, a mixing layer made of ones of the listed metals, an alloy made of ones of the listed metals or a laminated film made of ones of the listed metals.

An underfill resin (not shown) may be appropriately infiltrated between the first semiconductor chips 23, 24 and the second insulating layer 15 so as to fix the first semiconductor chips 23, 24 and protect the bumps 21, 22.

Then, as shown in FIG. 1C, a second resin layer 25 made of thermosetting resin is formed so as to seal the second wiring layer 16 and the first semiconductor chips 23, 24. The sealing can be performed by means of compression molding, transfer molding, injection molding, printing, film-laminating or the like.

Herein, the thermosetting resin may be a thermosetting resin commercially available such as epoxy resin.

After the flip-chip package, an underfill resin is formed so as to protect the functional surfaces of the first semiconductor chips 23, 24 and the bumps 21, 22 as connecting terminals. In the case of forming the underfill resin, if a no-flow underfill resin is employed, the flip-chip package for the first semiconductor chips 23 and 24 and the infiltration of the underfill resin can be performed simultaneously.

Figure 1D:
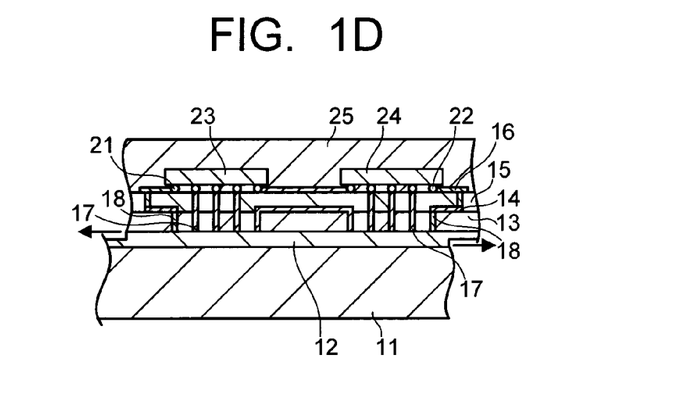
Figure 1E:
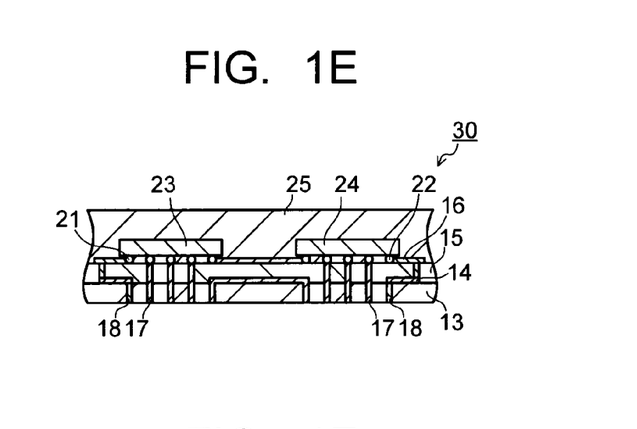

Then, the semiconductor device assembly as shown in FIG. 1C is heated to a predetermined temperature so that the viscosity of the first resin layer 12 made of the thermoplastic resin is lowered as shown in FIG. 1D. Then, the laminated body of the first insulating layer 13 through the second resin layer 15 is relatively shifted for the supporting substrate 11 under the condition that the main surface of the laminated body can be parallel to the main surface of the supporting substrate 11. In this case, since shear strength occurs between the laminated body and the supporting substrate 11, the laminated body can be separated from the supporting substrate 11. As a result, as shown in FIG. 1E, the laminated body can be separated as a semiconductor device intermediate body 30 from the supporting substrate 11.

The semiconductor device intermediate body 30 is a single sided package semiconductor device if the first insulating layer 13 and the second insulating layer 15 are employed as one substrate.

Herein, the separation between the laminated body and the supporting substrate 11 can be carried out by vertically shifting the laminated body relatively from the supporting substrate 11 to some degrees in addition to the sliding therebetween In this case, the separation between the laminated body and the supporting substrate 11 can be promoted.

The heating treatment may be conducted at a temperature within a temperature range of 150° C. to 300° C. Such a temperature range can not cause the deformations of the flip-chip bondings of the first semiconductor chips 23, 24 and of the wiring layers 14, 15, and thermal damage for the semiconductor assembly.

In order to perform the separation between the laminated body and the supporting substrate 11 by the thermal treatment, the first resin layer 12 is preferably made of a thermoplastic resin with a viscosity of 1000 Pa·s or less at a temperature within the range of 150° C. to 300° C.

The remnant of the first plastic resin 12 is solved and removed with a solvent.

Figure 1F:
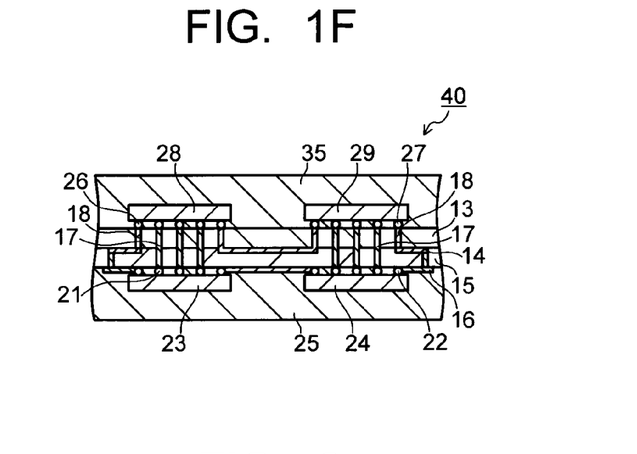

Then, as shown in FIG. 1F, a second semiconductor chips 28 and 29 are mounted on the surface, from which the supporting substrate 11 is separated and removed, of the first insulating layer 13 of the semiconductor device intermediate body 30 so as to be electrically connected with the first semiconductor chips 23 and 24 via the vias 17 and 18. Since the second semiconductor chips 28, 29 have the respective bumps 26, 27 at the rear surfaces thereof (i.e., functional surfaces thereof), in real, the second semiconductor chips 28 and 29 are electrically connected with the first semiconductor chips 23 and 24 via the bumps 26 and 27, respectively. If the vias 17 and 18 are made of Cu, the bumps 26 and 27 of the second semiconductor chips 28 and 29 are electrically connected with the Cu material of the vias 17 and 18. Moreover, bumps or metallic films may be formed on the vias 17 and 18 prior to the flip-chip package. The bumps and the metallic films may be made of a metal such as SnAg, Au, Sn, Ag, Cu, Bi, In, Ge, Ni, Pd, Pt, Pb, a mixing layer made of ones of the listed metals, an alloy made of ones of the listed metals or a laminated film made of ones of the listed metals. Alternatively, the bumps and the metallic films may be formed of Ni/Pd/Au or Ni/Au by means of electroless plating.

Herein, the bumps 26 and 27 may be made of a metal such as SnAg, Au, Sn, Ag, Cu, Bi, In, Ge, Ni, Pd, Pt, Pb, a mixing layer made of ones of the listed metals, an alloy made of ones of the listed metals or a laminated film made of ones of the listed metals. In the case that the flip-chip package is carried out for the second semiconductor chips 28 and 29, the functional surfaces of the semiconductor chips 28, 29 and the bumps 26, 27 as connecting terminals may be protected by an underfill resin.

When the second semiconductor chips 28 and 29 are mounted, the second resin layer 25 of the semiconductor device intermediate body 30 as the single sided package semiconductor is already hardened, so that the second resin layer 25 can be employed as a carrier member.

Then, as shown in FIG. 1F, the second semiconductor chips 28 and 29 are sealed by a third resin layer 25 as a sealing member to form an intended semiconductor device 40. Herein, an underfill resin may be formed between the second semiconductor chips 28, 29 and the surface, from which the supporting substrate 11 is separated and removed, of the first insulating layer 13 of the semiconductor device intermediate body 30. The semiconductor device 40 is a double sided package semiconductor device if the first insulating layer 13 and the second insulating layer 15 are employed as one substrate, respectively.

In this embodiment, in the manufacture of the semiconductor device intermediate body 30 constructed as the single sided package semiconductor device, the first resin layer 12 made of thermoplastic resin is located between the supporting substrate 11 and the first insulating layer 13 of the semiconductor device intermediate body 30, and heated to lower the viscosity thereof. Then, the supporting substrate 11 is relatively slid for the first insulating layer 13 to cause the shear strength therebetween and to separate the supporting substrate 11 from the first insulating layer 13 by utilizing the shear strength, thereby forming the semiconductor device intermediate body 30. Then, the second semiconductor chips 28 and 29 are mounted on the surface, from which the supporting substrate 11 is separated, of the semiconductor device intermediate body 30 to form the double sided package semiconductor device 40.

Therefore, since the supporting substrate 11 is not diminished at the separation therebetween, the supporting substrate 11 can be employed repeatedly. Moreover, since the separation of the supporting substrate 11 is carried out by lowering the viscosity of the first resin layer 12 through heating and utilizing the shear strength, which is originated from the relative lateral sliding, affecting the first resin layer 12, the separation can be carried out for a short period of time.

Then, the heating treatment may be conducted at a temperature within the range of 150° C. to 300° C. Such a temperature range can not cause the thermal failure such as the deformations of the flip-chip bonding of the semiconductor assembly as the semiconductor device intermediate body 30 and of the wiring layers 14, 16.

The semiconductor device 40 as shown in FIG. 1F may be chipped as occasion demands.

Second Embodiment

Figure 2:
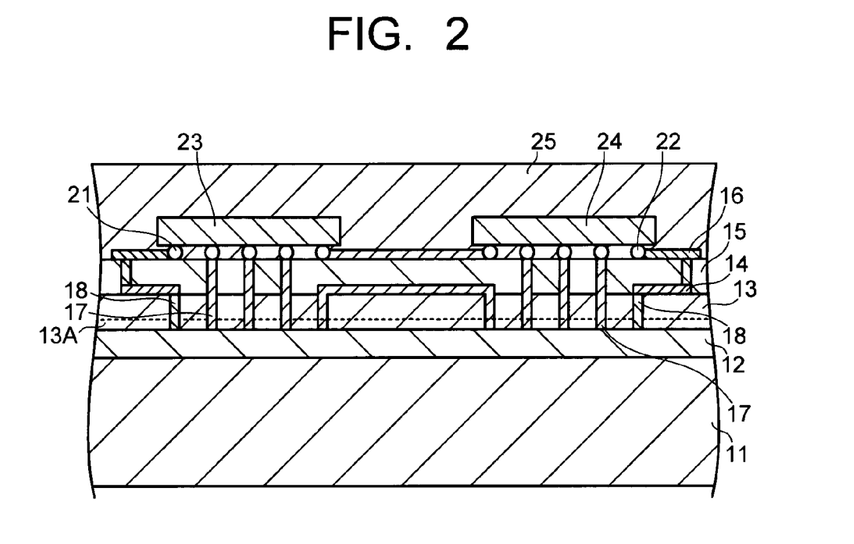
FIG. 2 relates to the steps of the method for manufacturing a semiconductor device according to a second embodiment.

FIG. 2 relates to the steps of the method for manufacturing a semiconductor device according to a second embodiment. This embodiment corresponds to a modified embodiment for the first embodiment so that this embodiment is similar to the first embodiment except that a trench 13A is provided at the first insulating layer 13 in the vicinity of the first resin layer 12. In this embodiment, therefore, the distinctive feature will be described below.

In this embodiment, since the trench 13A is formed at the first insulating layer 13 in the vicinity of the first resin layer 12, gases generated at the heating of the first resin layer 13 can be discharged outside through the trench 13A. In this point of view, the thermal expansion of the first resin layer 12 can be prevented when the first resin layer 12 is heated so that some disadvantages such as flip-chip bonding failure and deformation of wiring layer can be avoided.

The distinctive feature of this embodiment can be applied to all of the embodiments as will described below.

The intended gas discharging hole is not limited to the trench 13A, but may be formed in any shape. For example, the gas charging hole may be formed so as to be opened to the surface not sealed by the second resin layer 25 through the first insulating layer 13 and the second insulating layer 15.

Third Embodiment

Figure 3:
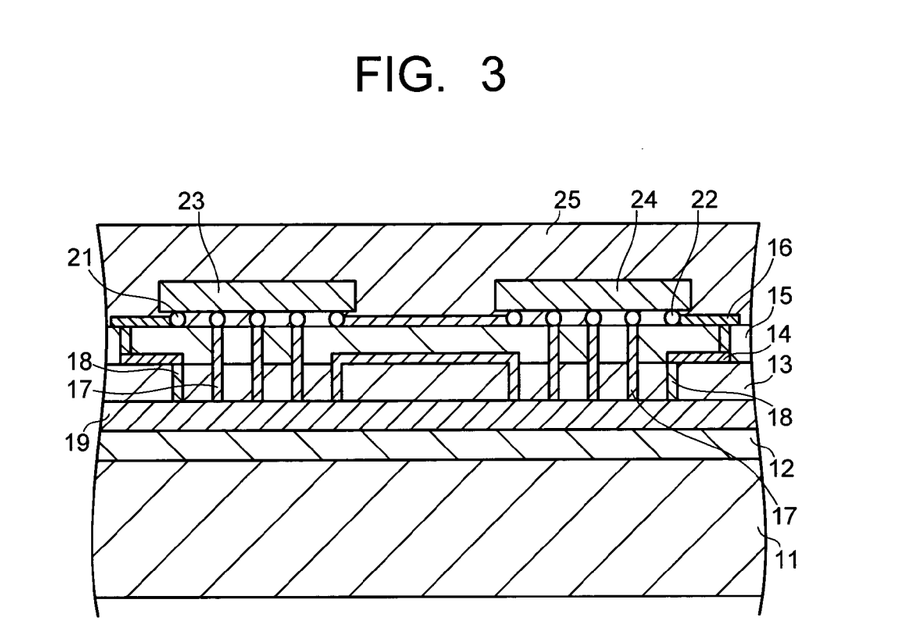
FIG. 3 relates to the steps of the method for manufacturing a semiconductor device according to a third embodiment.

FIG. 3 relates to the steps of the method for manufacturing a semiconductor device according to a third embodiment. This embodiment corresponds to a modified embodiment for the first embodiment so that this embodiment is similar to the first embodiment except that a metallic layer 19 is formed between the first resin layer 12 and the first insulating layer 13. In this embodiment, therefore, the distinctive feature will be described below.

In this embodiment, the metallic layer 19 is provided between the first resin layer 12 and the first insulating layer 13. Therefore, the infiltration of an etching solution and the exposure of a laser beam, which are to be used in the formation of via hole in the first insulating layer 13, for the first resin layer 12 can be effectively prevented so that the first resin layer 12 can not be partially or entirely diminished prior to the separation of the supporting substrate 11.

The metallic layer 19 may be made of a metal with high corrosion resistance such as Au, Pt, Pd or Ti, TiN, Ta, TaN, Ni, Cu, a complex film made of the ones listed above.

Fourth Embodiment

Figure 4:
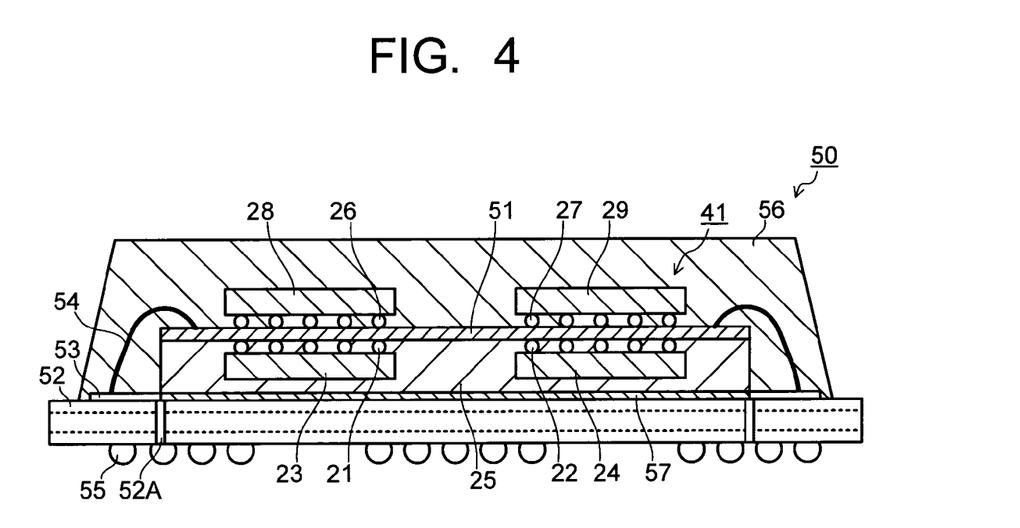
FIG. 4 relates to the steps of the method for manufacturing a semiconductor device according to a fourth embodiment.

FIG. 4 is a structural view showing an embodiment of the semiconductor device 40 manufactured as described above. In this embodiment, the semiconductor device module 50 is configured such that an assembly 41 with the second semiconductor chips 28, 29 which are not sealed by the third resin layer 35 is mounted on a motherboard 52 under the condition that the first semiconductor chips 23 and 24 are faced downward.

As shown in FIG. 4, therefore, the semiconductor module 50 includes an insulating substrate 51, the first semiconductor chips 23, 24 which are mounted on one surface of the substrate 51 and the second semiconductor chips 28, 29 which are mounted on the other surface of the substrate 51. The insulating substrate 51 may be comprised of the first insulating layer 13, the first wiring layer 14, the second insulting layer 15, the second wiring layer 16 and vias 17, 18. As described above, in this case, the first semiconductor chips 23, 24 are electrically connected with the second semiconductor chips 28, 29 via the vias 17, 18, respectively. As a matter of course, underfill resins may be formed between the first semiconductor chips 23, 24 and the corresponding insulating layer and between the second semiconductor chips 28, 29 and the corresponding insulating layer.

The assembly 41 is fixed to the mother board 52 via an adhesive 57. The assembly 41 is sealed by a resin layer 56 made of thermosetting resin.

Electrode pads 53 are formed on the main surface of the mother board 52, and electrically connected with the electrode pads (not shown) on the insulating substrate with wires 54. Moreover, solder balls 55 are formed on the rear surface of the motherboard 52, and electrically connected with an external device (not shown).

Some wiring layers are formed on the rear surface of the mother board 52 so as to electrically connect the electrode pads 53 with the solder balls 55 via electrode plugs 52A formed through the mother board 52.

In this embodiment, when the assembly 41 is mounted on the mother board 52, the first semiconductor chips 23 and 24 are located at the rear surface of the insulating substrate 51. In this case, since the first semiconductor chips 23 and 24 are sealed by the resin layer 25 made of hardened thermosetting resin, the resin layer 25 can function as a supporting member for mounting the assembly 41 on the mother board 52.

As described above, since the insulating substrate 51 is made of the insulating layers and the like, the total thickness of the insulating substrate 51 becomes small. In this point of view, if the assembly 41 is mounted on the mother board 52 by means of normal technique, the insulating substrate 51 may be broken and destroyed because a load is applied to the insulating substrate 51 from the upside.

In this embodiment, however, since the resin layer 25 is located under the insulating substrate 51 so as to function as a supporting member for the insulating substrate 51, the insulating substrate 51 can not be destroyed when the load is applied to the insulating substrate 51 from the upside thereof. As shown in FIG. 4, therefore, when the double sided package semiconductor device 40 is mounted on the mother board to form the mother board-mounted semiconductor module, the handling can be simplified so that the manufacturing yield of the semiconductor module 50 can be enhanced due to the prevention of the destruction of the insulating board 51.

Fifth Embodiment

FIGS. 5 and 6 are cross sectional views showing the steps of the method for manufacturing a semiconductor device according to a fifth embodiment.

Figure 5A:
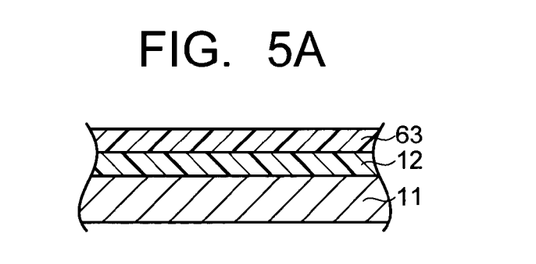
FIG. 5 relates to the steps of the method for manufacturing a semiconductor device according to a fifth embodiment.

First, as shown in FIG. 5A, a supporting substrate 11 made of Si semiconductor substrate or the like (e.g., a Si wafer with a diameter of 8 inches) is prepared. Then, a first resin layer 12 made of thermoplastic resin and a buffer layer 63 are subsequently formed on the supporting substrate 11. The first resin layer 12 may be made of polystyrene-based resin, methacrylic resin, polyethylene resin, polypropylene resin and cellulosic resin. For example, the thickness of the first resin layer 12 is set to 5 μm.

The buffer layer 63 may be made of thermosetting resin. In the heating for the peeling off process as will be described below, therefore, the buffer layer 63 is hardened as the first resin layer 12 is softened so as to prevent the creation of stress at the interface between the first resin layer 12 and the buffer layer 63. As a result, the breaking of the buffer layer 63 and the like can be prevented so that the effect/function of the peeling off process as will described below can be exhibited sufficiently.

Herein, the buffer layer 63 may be made of another material except the thermosetting resin only if the buffer layer 63 can exhibit the effect/function as will described below.

As the thermosetting resin, polyimide, xyron, phenol-based resin, acrylic resin can be exemplified. For example, the thickness of the buffer layer 13 may be set to 3 μm.

Figure 5B:
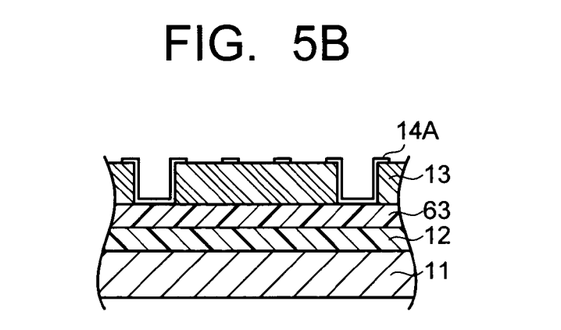

Then, as shown in FIG. 5B, a first insulating layer 13 is formed on the buffer layer 63. The first insulating layer 13 may be made of a polyimide film with a thickness of 3 μm. Then, photolithography is conducted for the first insulating layer 13 to form openings with a diameter of 20 μm at every pitch of 40 μm. Then, a seed film 14A is formed so as to embed the openings. The seed film 14A is comprised of a Ti film with a thickness of 0.1 μm and a Cu film with a thickness of 0.3 μm.

Figure 5C:
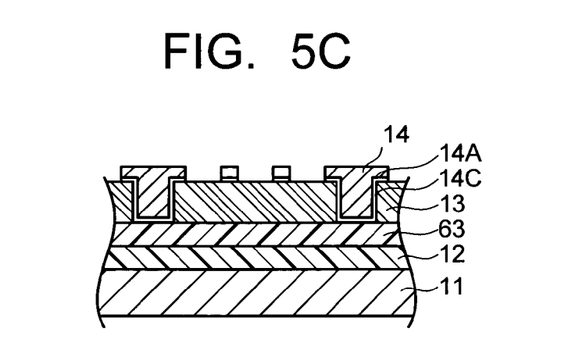

Then, a resist is coated in a thickness of 5 μm so that the seed film 14A is patterned by means of photolithography. Then, electrolytic plating is conducted using the patterned seed film 14A as an electrode to form a Cu electrode film. Thereafter, the resist is removed, and the seed film 14A is etched and removed, thereby forming a first wiring layer 14 as shown in FIG. 5C. The Cu electrode film is also formed in the openings to form vias 14C as interlayer conductors.

The Cu film of the seed film 14A is wet-etched by using a solution mixed by sulfuric acid solution and hydrogen peroxide solution, and the Ti film of the seed film 14A is wet-etched by using a solution mixed by ammonia water and hydrogen peroxide solution.

Thereafter, the step as shown in FIG. 5C is repeated so that a second insulating layer 15 and a third insulating layer 66 are subsequently formed on the first insulating layer 13. Then, electrolytic plating is conducted so as to embed the openings formed at the second insulating layer 15 by using a seed film 16A to form a second wiring layer 16 made of a Cu electrode film. The Cu electrode film is also formed in the openings to form vias 16C as interlayer conductors.

Figure 5D:
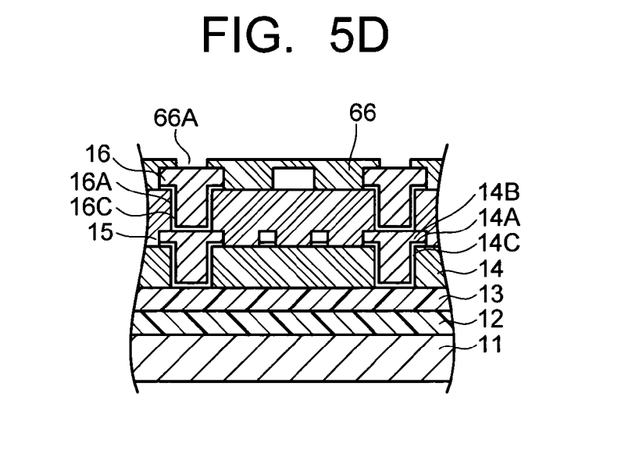

Then, the third insulating layer 66 is exposed and developed to form openings 66A thereat so as to expose the pad portions of the second wiring layer 16 (see, FIG. 5D). The diameter and the pitch of the opening 66A may be set to 20 μm and 40 μm, respectively.

Figure 6A:
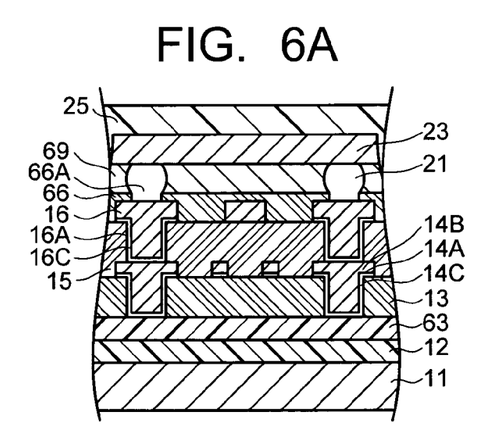
FIG. 6 relates to the steps of the method for manufacturing a semiconductor device according to the fifth embodiment.

Then, as shown in FIG. 6A, a first semiconductor chip 23 with bumps is mounted by means of flip-chip bonding. The flip-chip package is carried out in a reflow furnace using a flip-chip bonder. The used flux is removed by a cleaning liquid. Alternately, the oxide films of the bumps 21 and 22 are removed by means of plasma, and then, the flip-chip package may be carried out by means of pulsed heating using a flip-chip bonder under the condition of no flux. The bumps and the metallic films may be made of a metal such as SnAg, Au, Sn, Ag, Cu, Bi, In, Ge, Ni, Pd, Pt, Pb, a mixing layer made of ones of the listed metals, an alloy made of ones the listed metals or a laminated film made of ones of the listed metals. Alternatively, the bumps and the metallic films may be formed of Ni/Pd/Au or Ni/Au by means of electroless plating.

Thereafter, an underfill resin 69 is infiltrated between the first semiconductor chip 23 and the third insulating layer 66, and a second resin layer (sealing resin) 25 is formed so as to cover the underfill resin 69 and the first semiconductor chip 23.

Herein, the bumps 21 may be made of a metal such as SnAg, Au, Sn, Ag, Cu, Bi, In, Ge, Ni, Pd, Pt, Pb, a mixing layer made of ones of the listed metals, an alloy made of ones of the listed metals or a laminated film made of ones of the listed metals.

Figure 6B:
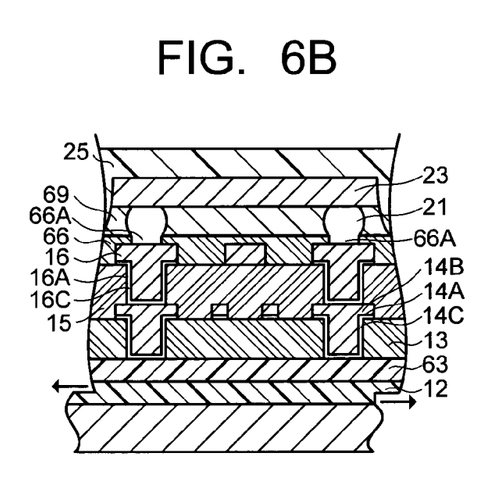

Then, the structural body as shown in FIG. 6B is heated at a temperature of 230° C. to lower the viscosity of the first resin layer 12 and thus, soften the first resin layer 12. Under the circumstance, the supporting substrate 11 is relatively slid for the buffer layer 63 laterally and vertically to shear the first resin layer 12, thereby separating the supporting substrate 11 and the buffer layer 63. The buffer layer 63 is not softened at such a temperature as described above and thus, remains hard.

In the peeling off process as shown in FIG. 6B, if the buffer layer 63 is not formed, strain stress, originated from the thermal expansion of the first resin layer 12, affects the insulating layers 13, 15, 66 and the wiring layers 14, 16 when the first resin layer 12 is heated and softened. In this case, the insulating layers 13, 15 and 66 may be deformed, and the wiring layers 14 and 16 are peeled off or shifted in position. Therefore, the thus obtained semiconductor device causes electric failure thereat and thus, may not exhibit the inherent effect/function.

On the other hand, when the buffer layer 63 is formed, the buffer layer 63 is not softened even though the first resin layer 12 is softened, and then, remains as it is. Therefore, the insulating layers 13, 15 and 66 can not be deformed, and the wiring layers 14 and 16 can not be peeled off or shifted in position. Therefore, the thus obtained semiconductor device does not cause electric failure thereat and thus, can exhibit the inherent effect/function. As a result, the manufacturing yield of the semiconductor device can be enhanced.

Herein, since the buffer layer 63 is made of thermosetting resin, the buffer layer 63 is hardened as the first resin layer 12 is softened so that the stress generation at the interface between the buffer layer 63 and the first resin layer 12 can be suppressed. In this point of view, in the peeling off process as described above, the breaking or the like of the buffer layer 63 can be effectively prevented.

Figure 6C:
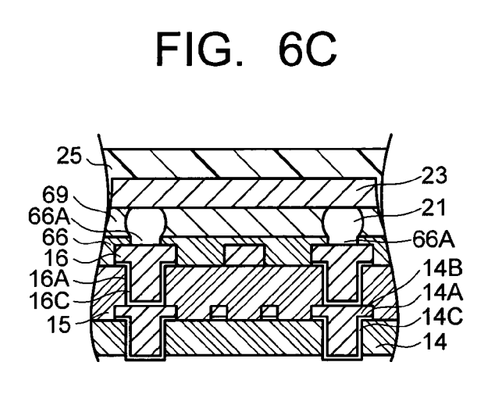

Then, as shown in FIG. 6C, the remnant of the first resin layer 12 adhering to the buffer layer 63 is removed with solvent such as acetone, and then, the buffer layer 63 is removed with an etching solution or $O_2$ asher.

Figure 6D:
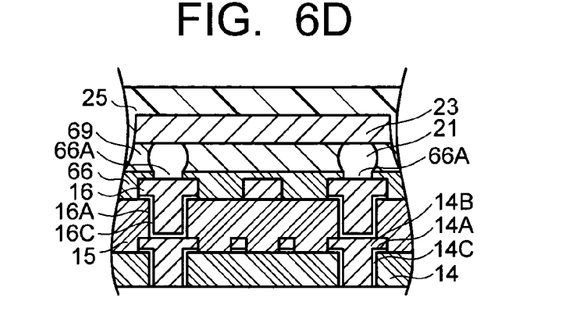

Then, as shown in FIG. 6D, the seed film 14A, which is exposed after the buffer layer 63 and the like are removed, is removed. For example, in this embodiment, the Ti film of the seed film 14A is wet-etched by using a solution mixed by ammonia water and hydrogen peroxide solution.

Figure 6E:
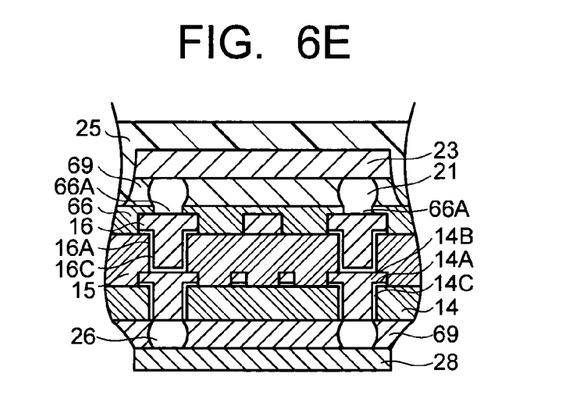

Then, as shown in FIG. 6E, a second semiconductor chip 28 with bumps 26 are mounted by means of flip-chip bonding. The bumps 26 may be made of a metal such as SnAg, Au, Sn, Ag, Cu, Bi, In, Ge, Ni, Pd, Pt, Pb, a mixing layer made of ones of the listed metals, an alloy made of ones of the listed metals or a laminated film made of ones of the listed metals. In this case, an underfill resin is formed so as to protect the functional surface of the second semiconductor chip 28 and the bumps 26 as connecting terminals. In the case of forming the underfill resin, if a no-flow underfill resin is employed, the flip-chip package for the first semiconductor chips 23 and 24 and the infiltration of the underfill resin can be performed simultaneously.

Herein, bumps or electrode layers may be formed on the exposed surfaces of the vias 14C in advance. The bumps and the metallic films may be made of a metal such as SnAg, Au, Sn, Ag, Cu, Bi, In, Ge, Ni, Pd, Pt, Pb, a mixing layer made of ones of the listed metals, an alloy made of ones the listed metals or a laminated film made of ones of the listed metals. Alternatively, the bumps and the metallic films may be formed of Ni/Pd/Au or Ni/Au by means of electroless plating.

Figure 7:
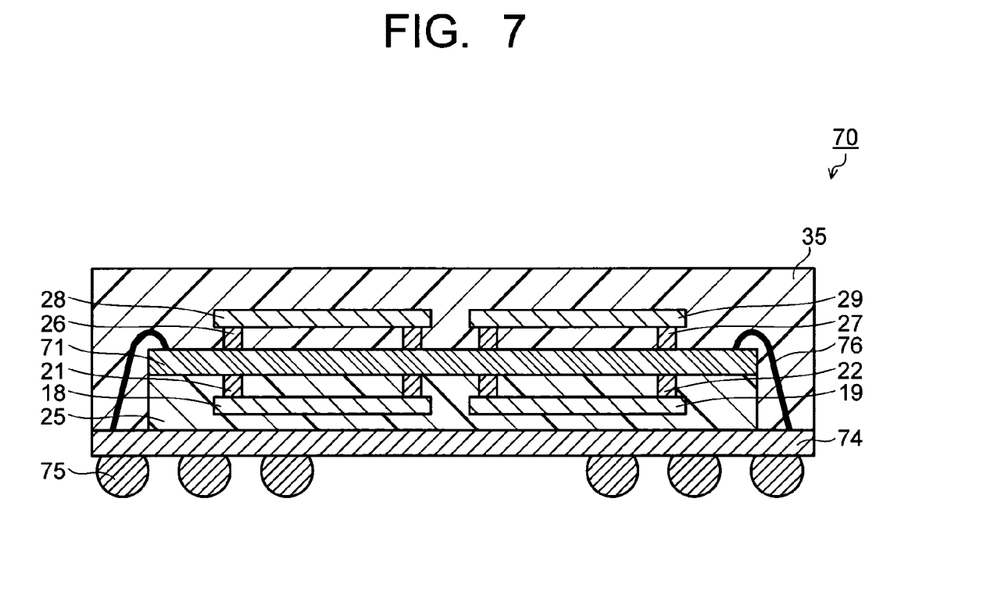
FIG. 7 is a cross sectional view schematically showing the structure of a semiconductor device according to an embodiment.

FIG. 7 is a cross sectional view schematically showing a semiconductor module containing semiconductor devices manufactured as described above.

In the semiconductor device module 70 shown in FIG. 7, the second semiconductor chips 28 and 29 are electrically connected with the top surface of a printed circuit board 71 via the bumps 26 and 27 while the first semiconductor chips 18 and 19 are electrically connected with the bottom surface of the printed circuit board 71 via the bumps 21 and 22. The printed circuit board 71 and the first semiconductor chips 18, 19 are disposed and fixed for a mother board 74 via the sealing resin layer (second resin layer) 25 which was formed as described above. Solder balls 75 are formed on the rear surface of the mother board 74 so as to be electrically connected with an external circuit.

The printed circuit board 71 is electrically connected with the mother board 74 via Au wires 76, and the thus obtained assembly is sealed entirely by the molding resin (third resin layer) 35.

In the semiconductor module 70 shown in FIG. 7, the printed circuit board 71 is comprised of the insulating layers 13, 15, 66, the wiring layers 14, 16 and the vias 14C, 16C as described above. The electrode layer contacting the bumps 26 are omitted and the underfill resin is also omitted.

Then, the semiconductor device module 70 shown in FIG. 7 is set under heat cycle test so as to examine the reliability thereof. In the heat cycle test, 1 cycle is defined as −55° C. (30 min) ~25° C. (5 min) ~125° C. (30 min). As a result, the connecting points of the semiconductor chips 23, 24, 28, 29 are not broken.

Sixth Embodiment

Figure 8:
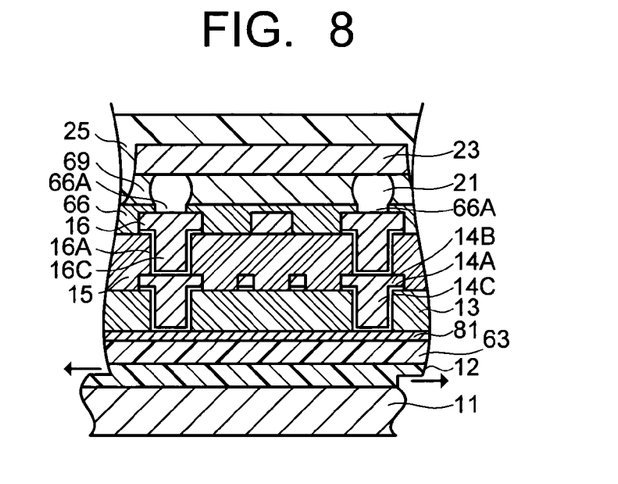
FIG. 8 is a cross sectional view showing the step of the method for manufacturing a semiconductor device according to a sixth embodiment.

FIG. 8 is a cross sectional view showing the steps of the method for manufacturing a semiconductor device according to a sixth embodiment. FIG. 8 corresponds to FIG. 7D in the fifth embodiment so that this embodiment is similar to the fifth embodiment except that a metallic layer 81 is located between the buffer layer 63 and the first insulating layer 13.

In this embodiment, since the metallic layer 81 is formed between the buffer layer 63 and the first insulating layer 13, the metallic film 81 can function as an etching stopper film for the etching removal of the buffer layer 63 after the supporting substrate 11 is peeled off from the buffer layer 63 via the first resin layer 12, as described in the first embodiment with reference to FIG. 6C. In the etching removal of the buffer layer 63, therefore, the insulating layers 13, 15, 66 and the wiring layers 14, 16 are not affected by the etching removal, and thus, remain as they are. The metallic layer 81 may be made of a metal with high corrosion resistance such as Au, Pt, Pd or Ti, TiN, Ta, TaN, Ni, Cu, a complex film made of the ones listed above.

As a result, the deterioration in performance of the semiconductor module as shown in FIG. 7 can be effectively prevented.

Seventh Embodiment

FIGS. 9 and 10 are cross sectional views showing the steps of the method for manufacturing a semiconductor device according to a seventh embodiment.

Figure 9A:
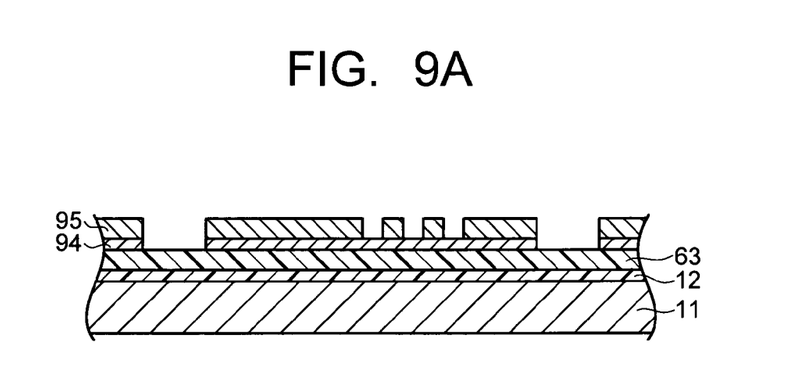
FIG. 9 relates to the steps of the method for manufacturing a semiconductor device according to a seventh embodiment.

First, as shown in FIG. 9A, a supporting substrate 11 made of, e.g., a Si wafer with a diameter of 8 inches is prepared. Then, a first resin layer 12 made of thermoplastic resin and a buffer layer 63 are subsequently formed on the supporting substrate 11. The first resin layer 12 may be made of the same material as in the sixth embodiment, and the buffer layer 63 is also made of the same material as in the sixth embodiment.

Then, a SiN film 94 is formed in a thickness of 0.1 μm by means of CVD, and a $SiO_2$ film is formed in a thickness of 0.1 μm. A resist film is coated in a thickness of 5 μm so that openings with a diameter of 20 μm at every pitch of 40 μm.

The diameter and pitch of the openings formed in the SiN film 94 and the $SiO_2$ film are set similar to the ones in the embodiments as described above, but can be set smaller due to the characteristics of an inorganic film such as the SiN film. The pattern of a wiring can be much fined as will described below.

Figure 9B:
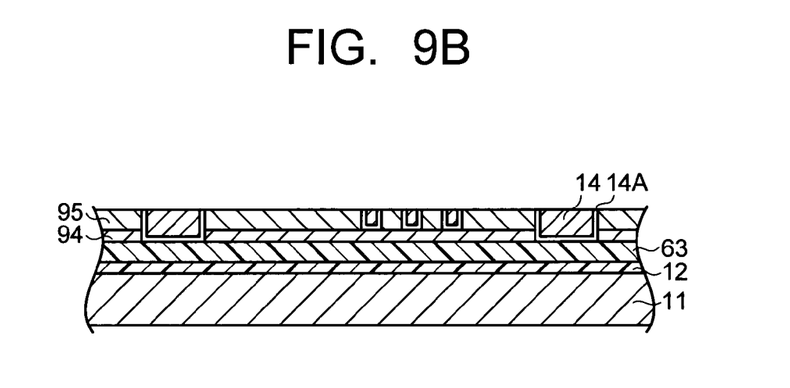

Then, as shown in FIG. 9B, a seed film 14A is formed in the openings to conduct electrolytic plating of copper. The thus obtained Cu plated film is flattened by means of CMP to embed the openings. As a result, a first wiring layer 14 is formed so that the surface level of the first wiring layer 14 is set equal to the surface level of the $SiO_2$ film 95 by embedding the opening. The seed film 14A may be configured as a two-layered structure made of a Ti film and a Cu film as described in the above-embodiments.

Figure 9C:
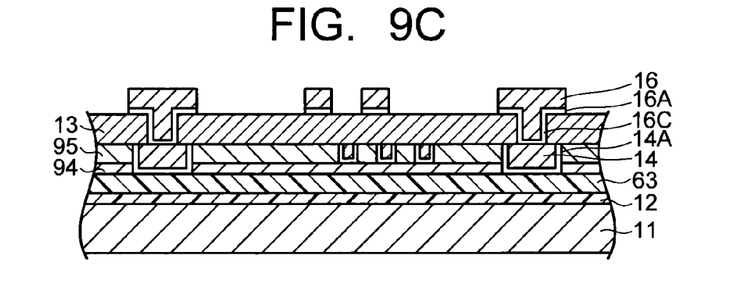

Then, as shown in FIG. 9C, a first insulating layer 13 is formed on the SiN film 94 and the $SiO_2$ film 95. The first insulating layer 13 may be made of a polyimide film with a thickness of 3 μm. Then, photolithography is conducted for the first insulating layer 13 to form openings with a diameter of 20 μm at every pitch of 40 μm. The openings are positioned at the first wiring layer 14. Then, a seed film 16A is formed so as to embed the openings and electrolytic plating of cupper is conducted. As a result, vias 16C are formed in the openings and a second wiring layer 15 is formed on the first insulating layer 13.

Figure 9D:
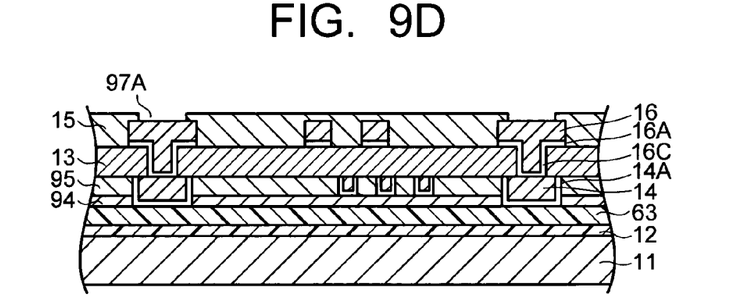

Then, as shown in FIG. 9D, a second insulating layer 15 is formed on the first insulating layer 13 so as to cover the second wiring layer 16 and openings 97A are formed so as to expose the pads of the second wiring layer 16 using a given resist as a mask.

Figure 10A:
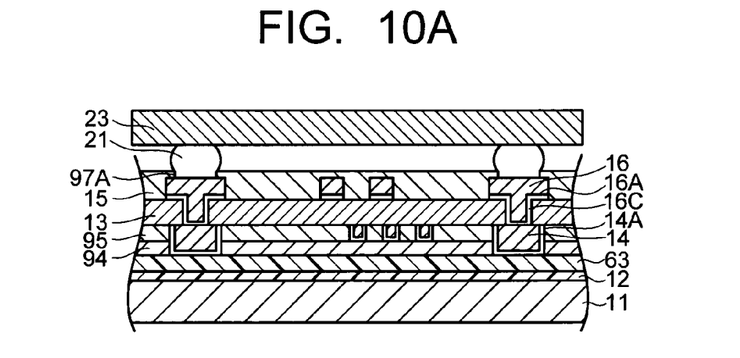
FIG. 10 relates to the steps of the method for manufacturing a semiconductor device according to the seventh embodiment.

Then, as shown in FIG. 10A, bumps 21 are formed in the openings 97A so that a first semiconductor chip 23 is mounted via the bumps 21 by means of flip-chip bonding.

Figure 10B:
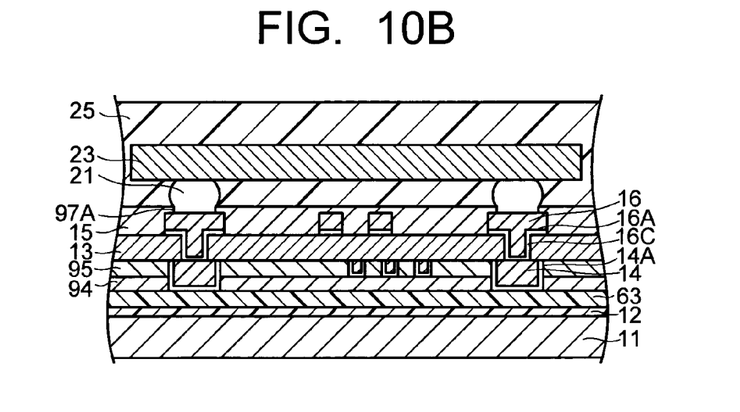

The flip-chip package can be performed in the same manner as in the above embodiments, and the bumps 21 may be made of the same material as in the above embodiments. Then, as shown in FIG. 10B, a sealing resin (second resin layer) 25 is formed so as to cover the first semiconductor chip 23. Alternatively, an electrode layer is formed in the openings 97A before the bumps 21 are formed. The electrode layer may be made in the same manner as in the above embodiments.

Figure 10C:
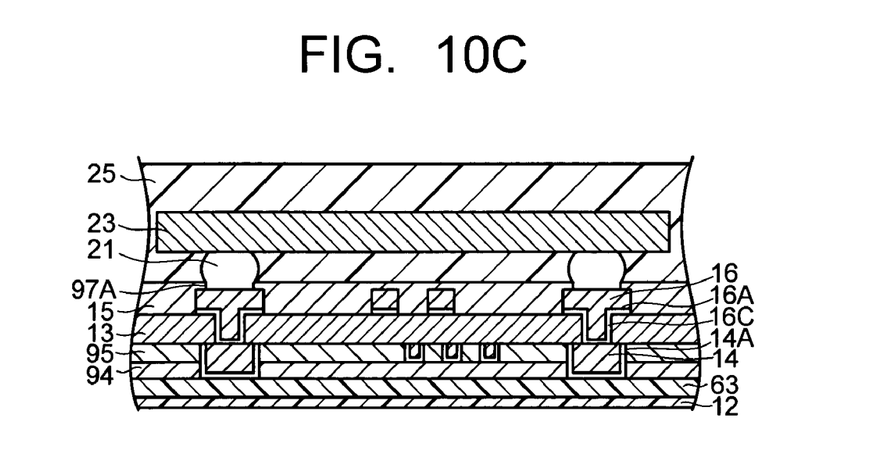

Then, the structural body shown in FIG. 10C is heated at a temperature of 230° C., for example, in the same manner as in the above embodiments to lower the viscosity of the first resin layer 12 and thus, soften the first resin layer 12 so that the supporting substrate 11 and the buffer layer 63 are relatively shifted one another to shear the first resin layer 12, thereby separating the supporting substrate 11 and the buffer layer 63 one another.

In this embodiment, even though the first resin layer 12 is softened, the buffer layer 63 is not softened to remain as it is. Therefore, no strain stress affects the insulating layers 13, 15 and the wiring layers 14, 16 which are located on the buffer layer 63 so that the wiring layers 14 and 15 can not be peeled off and shifted in position. As a result, the intended semiconductor device has no electric failure. In this point of view, the semiconductor device can exhibit the inherent effect/function so that the manufacturing yield of the semiconductor device can be enhanced.

Figure 10D:
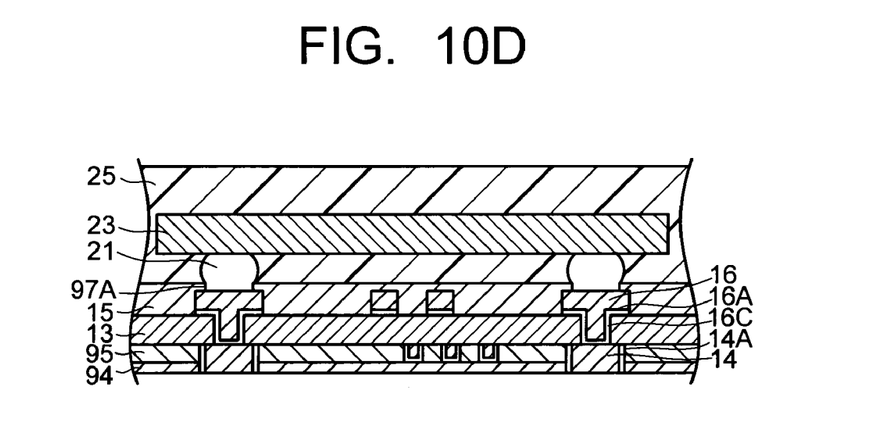

The case where the semiconductor is manufactured with no buffer layer has already described in the above embodiment. Then, as shown in FIG. 10D, the remnant of the first resin layer 12 adhering to the buffer layer 63 is removed with a solvent such as acetone and then, the buffer layer 63 is removed with an etching solution or an $O_2$ asher.

Figure 10E:
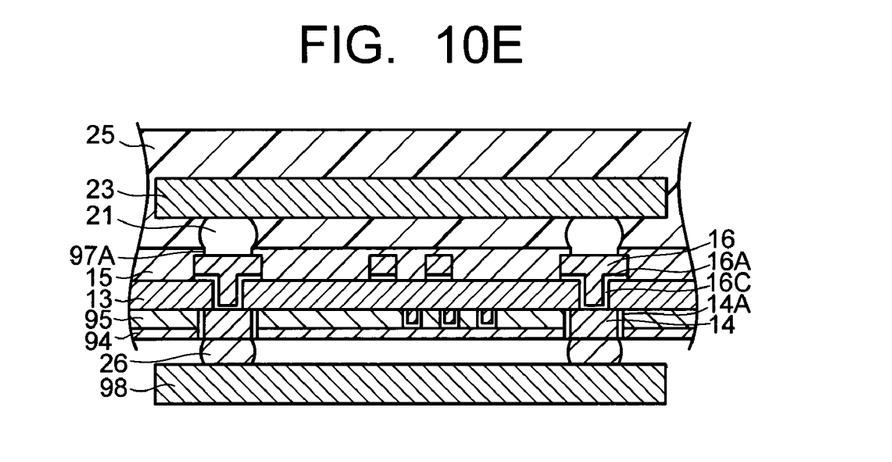

Then, as shown in FIG. 10E, the seed film 14A exposed by removing the buffer layer 63 is removed in the same manner as in the above embodiments. Thereafter, bumps 26 are formed on the exposed first wiring layer 14. The bumps 26 may be made by means of plating, printing, ball mounting or the like. The bumps 26 may be made of a metal such as SnAg, Au, Sn, Ag, Cu, Bi, In, Ge, Ni, Pd, Pt, Pb, a mixing layer made of ones of the listed metals, an alloy made of ones the listed metals or a laminated film made of ones of the listed metals.

Then, the thus obtained semiconductor device intermediate body with the bumps is chipped by means of dicing. Each chip made from the semiconductor device intermediate body is mounted on a package board 98 by means of flip-chip bonding. Then, an underfill resin (not shown) is infiltrated between the chips and the package board 98. Then, solder balls are formed at the rear surface of the package board 98 to form a BGA package (not shown). An electrode layer may be formed on the exposed first wiring layer 14 before the bumps 26 are formed. The electrode layer may be made of a metal such as Au, Ag, Ni, Pd, Pt, Pb, a mixing layer made of ones of the listed metals, an alloy made of ones the listed metals or a laminated film made of ones of the listed metals. Alternatively, the electrode layer may be formed of Ni/Pd/Au or Ni/Au by means of electroless plating.

Eighth Embodiment

FIG. 11 relates to cross sectional views showing the steps of the method for manufacturing a semiconductor device according to an eighth embodiment.

Figure 11A:
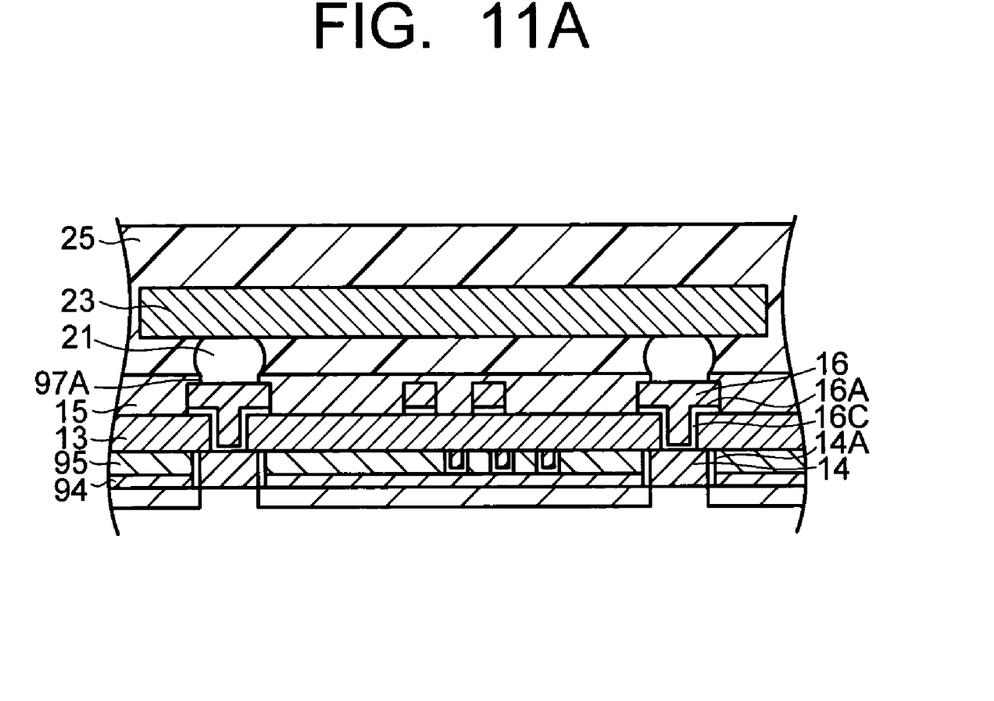
FIG. 11 relates to the steps of the method for manufacturing a semiconductor device according to an eighth embodiment.
Figure 11B:
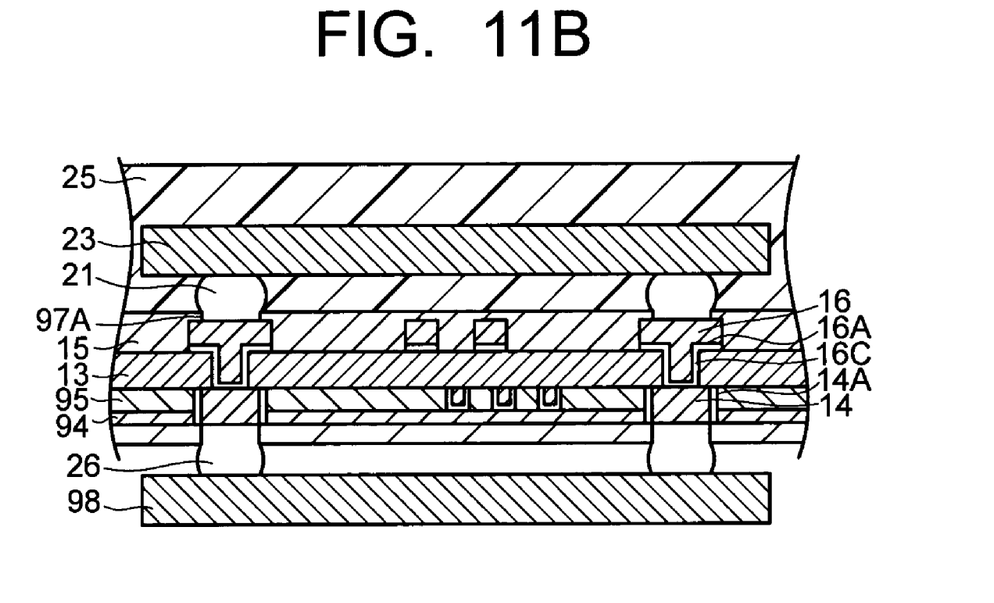

In this embodiment, as shown in FIG. 11A, the openings are formed by means of laser processing or the like without the removal of the buffer layer 63 after the step shown in FIG. 10C in the seventh embodiment. Then, as shown in FIG. 11B, the bumps 26 are formed in the openings. The bumps 26 may be made of a metal such as SnAg, Au, Sn, Ag, Cu, Bi, In, Ge, Ni, Pd, Pt, Pb, a mixing layer made of ones of the listed metals, an alloy made of ones the listed metals or a laminated film made of ones of the listed metals.

Then, the thus obtained semiconductor device intermediate body with the bumps is chipped by means of dicing. Each chip made from the semiconductor device intermediate body is mounted on a package board 98 by means of flip-chip bonding. Then, an underfill resin (not shown) is infiltrated between the chips and the package board 98. An electrode layer may be formed on the exposed first wiring layer 14 before the bumps 26 are formed. The electrode layer may be made of a metal such as Au, Ag, Ni, Pd, Pt, Pb, a mixing layer made of ones of the listed metals, an alloy made of ones the listed metals or a laminated film made of ones of the listed metals. Alternatively, the electrode layer may be formed of Ni/Pd/Au or Ni/Au by means of electroless plating.

In the comparison of the eighth embodiment with the seventh embodiment, the step for forming the openings to expose the first wiring layer 14 in the eighth embodiment is different from the step for forming the openings to expose the first wiring layer 14 in the seventh embodiment while other steps in the eighth embodiment are similar to other steps in the seventh embodiment. Therefore, the eighth embodiment can exhibit the effect/function originated from the buffer layer 63.

Although the present invention was described in detail with reference to the above examples, this invention is not limited to the above disclosure and every kind of variation and modification may be made without departing from the scope of the present invention.

For example, in the embodiments, the first semiconductor chips 23, 24 and the second semiconductor chips 28, 29 are mounted by means of flip-chip bonding, but may be by means of wire bonding.

Moreover, in the case that the sealing step using the second resin layer 25 is carried out to form the semiconductor device 40, some conducting layers made of the respective Cu posts may be formed in advance so that the tops of the Cu posts are exposed by grinding the second resin layer 25. In this case, a plurality of semiconductor devices 40 may be stacked to form a stacked semiconductor module.

In addition, in the seventh embodiment, the wiring layers are made by using the inorganic insulating layers and the organic insulating layers to form the semiconductor chip to be mounted, and then, the single sided package semiconductor device using the flip-chip bonding is formed by removing the supporting substrate. For example, after the resin layers and the wiring layers are formed to constitute a semiconductor chip to be mounted as described in the first through third embodiments, the fifth embodiment and the sixth embodiment, the intended single sided package semiconductor device can be formed by removing the supporting substrate. In the seventh and eighth embodiments, after the supporting substrate is removed, the second semiconductor chip can be mounted to form a double sided package semiconductor device.

What is claimed is:

1. A method for manufacturing a semiconductor device, comprising:
    forming a first resin layer made of thermoplastic resin on a supporting substrate;
    forming an insulating layer on the first resin layer;
    forming an interlayer connector through the insulating layer;
    forming a wiring layer on the first resin layer so as to be electrically connected with the interlayer connector;
    mounting a first semiconductor chip on the wiring layer; and
    heating the first resin layer so that the supporting substrate and the insulating layer are relatively shifted one another to shear the first resin layer, thereby separating the supporting substrate and the insulating layer.

2. The method of claim 1,
    wherein a viscosity of the first resin layer is 1000 Pa·s or less at a temperature within a range of 150° C. to 300° C., wherein the first resin layer is sheared at the temperature.

3. The method of claim 1, further comprising:
    forming a metallic layer between the first resin layer and the insulating layer; and
    removing the metallic layer after the supporting substrate and the insulating layer are separated from one another.

4. The method of claim 1, further comprising:
    forming a hole for discharging gases generated at the heating of the first resin layer at at least one of the insulating layer and the wiring layer.

5. The method of claim 1, further comprising:
    sealing the wiring layer and the first semiconductor chip with a second resin layer made of thermosetting resin,
    wherein the first resin layer is sheared to form a single sided package semiconductor device containing the insulating layer, the wiring layer, the first semiconductor chip and the second resin layer.

6. The method of claim 5, further comprising:
    defining the single sided package semiconductor device as a semiconductor device intermediate body so that a second semiconductor chip is mounted on a surface, from which the supporting substrate is removed, of the insulating layer of the semiconductor device intermediate body so as to be electrically connected with the interlayer connector; and
    sealing the second semiconductor chip with a third resin layer to form a double sided package semiconductor device.

7. The method of claim 6, further comprising:
    implementing underfill for the second semiconductor chip after the second semiconductor chip is flip-chip bonded with another wiring layer so as to protect a functional surface of the second semiconductor chip and connecting terminals formed through flip-chip bonding.

8. The method of claim 6,
    wherein when the second semiconductor chip is mounted, the second resin layer of the single sided package semiconductor device as the semiconductor device intermediate body is used as a carrier member.

9. The method of claim 6,
    wherein when the double sided package semiconductor device is mounted on a mother board, the second resin layer of the single sided package semiconductor device as the semiconductor device intermediate body is used as a supporting member.

10. The method of claim 1, further comprising:
    implementing underfill for the first semiconductor chip after the first semiconductor chip is flip-chip bonded with the wiring layer so as to protect a functional surface of the first semiconductor chip and connecting terminals formed through flip-chip bonding.

11. A method for manufacturing a semiconductor device, comprising:
    forming a first resin layer made of thermoplastic resin on a supporting substrate;
    forming a buffer layer on the first resin layer;
    forming an insulating layer on the first resin layer;
    forming an interlayer connector through the insulating layer;
    forming a wiring layer on the first resin layer so as to be electrically connected with the interlayer connector;
    mounting a first semiconductor chip on the wiring layer; and heating the first resin layer so that the supporting substrate and the buffer layer are relatively shifted one another to shear the first resin layer, thereby separating the supporting substrate and the buffer layer.

12. The method of claim 11,
wherein a viscosity of the first resin layer is 1000 Pa·s or less at a temperature within a range of 150° C. to 300° C., wherein the first resin layer is sheared at the temperature.

13. The method of claim 11, further comprising:
forming a metallic layer between the buffer layer and the wiring layer; and
removing the metallic layer after the supporting substrate and the buffer layer are separated from one another.

14. The method of claim 11, further comprising:
forming a hole for discharging gases generated at the heating of the first resin layer at at least one of the insulating layer and the wiring layer.

15. The method of claim 11, further comprising:
sealing the wiring layer and the first semiconductor chip with a second resin layer made of thermosetting resin,
wherein the first resin layer is sheared to form a single sided package semiconductor device containing the insulating layer, the wiring layer, the first semiconductor chip and the second resin layer.

16. The method of claim 15, further comprising:
defining the single sided package semiconductor device as a semiconductor device intermediate body so that a second semiconductor chip is mounted on a surface, from which the supporting substrate is removed, of the insulating layer of the semiconductor device intermediate body so as to be electrically connected with the interlayer connector; and
sealing the second semiconductor chip with a third resin layer to form a double sided package semiconductor device.

17. The method of claim 16, further comprising:
implementing underfill for the second semiconductor chip after the second semiconductor chip is flip-chip bonded with another wiring layer so as to protect a functional surface of the second semiconductor chip and connecting terminals formed through flip-chip bonding.

18. The method of claim 16,
wherein when the second semiconductor chip is mounted, the second resin layer of the single sided package semiconductor device as the semiconductor device intermediate body is used as a carrier member.

19. The method of claim 16,
wherein when the double sided package semiconductor device is mounted on a mother board, the second resin layer of the single sided package semiconductor device as the semiconductor device intermediate body is used as a supporting member.

20. The method of claim 11, further comprising:
implementing underfill for the first semiconductor chip after the first semiconductor chip is flip-chip bonded with the wiring layer so as to protect a functional surface of the first semiconductor chip and connecting terminals formed through flip-chip bonding.

* * * * *